United States Patent
Fan et al.

(10) Patent No.: US 8,049,339 B2
(45) Date of Patent: Nov. 1, 2011

(54) SEMICONDUCTOR PACKAGE HAVING ISOLATED INNER LEAD

(75) Inventors: Wen-Jeng Fan, Hsinchu (TW); Yu-Mei Hsu, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 401 days.

(21) Appl. No.: 12/276,970

(22) Filed: Nov. 24, 2008

(65) Prior Publication Data
US 2010/0127362 A1    May 27, 2010

(51) Int. Cl.
H01L 23/48    (2006.01)

(52) U.S. Cl. ........ 257/776; 257/668; 257/692; 257/735; 257/E23.037

(58) Field of Classification Search ................ 257/668, 257/E23.036, E23.037, 692, 735, 776
See application file for complete search history.

(56) References Cited

U.S. PATENT DOCUMENTS
| | | | |
|---|---|---|---|
| 5,206,536 A | | 4/1993 | Lim |
| 6,593,649 B1 * | | 7/2003 | Lin et al. ............... 257/697 |
| 6,984,878 B2 * | | 1/2006 | Park et al. .............. 257/670 |
| 7,592,691 B2 * | | 9/2009 | Corisis et al. ........... 257/686 |
| 2005/0189643 A1 * | | 9/2005 | Zhou et al. ............. 257/690 |
| 2005/0236698 A1 * | | 10/2005 | Ozawa et al. ........... 257/666 |

FOREIGN PATENT DOCUMENTS
TW    I287876    1/2007
* cited by examiner

*Primary Examiner* — Wael Fahmy
*Assistant Examiner* — John C Ingham
(74) *Attorney, Agent, or Firm* — Muncy, Geissler, Olds & Lowe, PLLC

(57) ABSTRACT

A semiconductor package with isolated inner lead(s) is revealed. A chip is disposed on a leadframe segment and encapsulated by an encapsulant. The leadframe segment includes a plurality of leads, an isolated lead, and an external lead where each lead has an internal portion and an external portion. The isolated inner lead is completely formed inside the encapsulant and the external lead is partially formed inside and extended outside the encapsulant. At least one of the internal portions of the leads is located between the isolated inner lead and the external lead. Two fingers are formed at two opposing ends of the isolated inner lead without covering by the chip. One of the fingers imitates a plurality of fingers of the leads to arrange along a first side of the chip. The other finger of the isolated inner lead and a finger of the external lead are arranged along a second side of the chip. A jumping wire electrically connecting the isolated inner lead and the external lead is adjacent to the second side to achieve the redistribution of pin assignments without affecting wire-bonding. Especially, this package can be applied for multi-chip stacking.

16 Claims, 9 Drawing Sheets

SEMICONDUCTOR PACKAGE HAVING ISOLATED INNER LEAD

FIELD OF THE INVENTION

The present invention relates to semiconductor devices, especially to leadframe-based semiconductor packages with encapsulated isolated inner leads.

BACKGROUND OF THE INVENTION

Among many semiconductor packages, BGA (Ball Grid Array) packages implement PCB substrates as chip carriers. Since the circuitry of a substrate can be isolated in different metal layers electrically connected with plated through holes (PTHs), therefore, redistributing pin assignments can easily be done by multiple circuit layers of a substrate and PTHs. Chip-On-Lead (COL) packages are another well-known packages implementing leadframes as chip carriers where the back surface of a chip is attached to a plurality of leads of a leadframe. Even though COL package has the advantages of lower cost, however, the wire-bonding area is limited and it is very hard to redistribute pin assignments. Moreover, there is only one layer of leads of a leadframe which is mostly covered by a chip and the leads of a leadframe have to be clamped by top and bottom mold tools during molding processes. It is very difficult for COL packages to have multi-layer, electrically-isolated metal circuitry as a substrate to redistribute pin assignments. A COL leadframe-based semiconductor package related patent has been disclosed in Taiwan Patent No. 1287876, entitled "Semiconductor package".

A cross-sectional view of a conventional COL leadframe-based semiconductor package 100 is shown in FIG. 1. A partial top view of a leadframe segment 120 inside the encapsulant of the conventional leadframe-based semiconductor package 100 is shown in FIG. 2. A partial top view of some components of the conventional leadframe-based semiconductor package 100 inside an encapsulant 110 is shown in FIG. 3.

The conventional semiconductor package 100 primarily comprises an encapsulant 110, a leadframe segment 120, a plurality of chips 130 and 170 and a plurality of first bonding wires 141 and second bonding wires 142. As shown in FIG. 2, the leadframe segment 120 includes a plurality of leads 121 and a plurality of short leads 126. The chips 130 and 170 are carried on the leads 121. Each lead 121 has an internal portion 124 inside the encapsulant 110 and an external portion 125 extended outside the encapsulant 110. The back surface of the first chip 130 is attached to the internal portions 124 of the leads 121 by adhesive tapes, therefore, the sections of the internal portions 124 covered by the chip 130 can not be used for wire bonding. As shown in FIG. 1 and FIG. 3, normally the first bonding wires 141 electrically connect a plurality of first electrodes 131 on the active surface of the first chip 130 to the internal ends of the internal portions 124 not covered by the chip 130 and to the internal ends of the short leads 126. The second chip 170 is stacked on the first chip 130, as shown in FIG. 1 and FIG. 3, where the second bonding wires 142 electrically connect a plurality of second electrodes 171 on the second chip 170 to the internal ends of the internal portions 124 not covered by the first chip 130 and to the internal ends of the short leads 126. Therefore, the wire-bonding area of the chips in a COL package is very limited and complicated, especially for multi-chip stacking packages where the wire-bonding density is much higher. Parts of the wire bonding diagram of the first bonding wires 141 and the second bonding wires 142 is shown in FIG. 3 if the first bonding wires 141 and the second bonding wires 142 can not cross bonding, then the pin assignment can not be redistributed. If the first bonding wires 141 and the second bonding wires 142 are cross bonding due to pin assignments, then the gaps between the crossing bonding wires will be smaller leading to electrical short caused by wire sweeping during molding.

A leadframe-based but not COL type semiconductor package with redistribution of pin assignments is disclosed in U.S. Pat. No. 5,206,536, where the semiconductor package is a Lead-On-Chip (LOC) package and the fingers of the leads are attached to the tape disposed on the active surface of a chip. Further attached to the tape is a comb-like conductive layer as electrical redistributing components. The comb-like conductive layer has a plurality of comb teeth between the lead fingers to redistribute pin assignments. Additionally, the leads have a plurality of downset bends adjacent to the lead fingers to avoid electrical short with the comb-like conductive layer. Since the locations of the lead fingers and the comb-like conductive layer on the active surface of a chip is necessary to implement this technology, it can not be implemented in Chip-On-Lead (COL) packages nor multi-chip packages.

SUMMARY OF THE INVENTION

The main purpose of the present invention is to provide a leadframe-based semiconductor package having isolated inner lead(s) to achieve redistributing pin assignments of the leads from a leadframe without affecting nor changing the constrained wire-bonding area located at edge(s) of a chip, especially for COL multi-chip package with wire-bonding connections.

According to the present invention, a leadframe-based semiconductor package is disclosed, primarily comprising an encapsulant, a leadframe segment, a first chip, a plurality of first bonding wires, and a jumping wire. The leadframe segment includes a plurality of leads, an isolated inner lead, and an external lead where the isolated inner lead is completely formed inside the encapsulant and the external lead is partially formed inside and extended outside the encapsulant. Each lead has an internal portion disposed inside the encapsulant and an external portion extended outside the encapsulant where at least one of the internal portions is located between the isolated inner lead and the external lead. The first chip is disposed on the leadframe segment and encapsulated by the encapsulant where the first chip has a plurality of first electrodes. Each internal portion has a first finger. A second finger and a third finger are formed at two opposing ends of the isolated inner lead. The external lead has a fourth finger. The first fingers and the second finger are arranged along a first side of the first chip without covered by the first chip and the third finger and the fourth finger are arranged along a second side of the first chip without covered by the first chip. The first bonding wires electrically connect the first electrodes of the first chip to the first fingers of the internal portions and to the second finger of the isolated inner lead. The jumping wire electrically connects the third finger of the isolated inner lead to the fourth finger of the external lead by overpassing the interposing one of the internal portions.

The leadframe-based semiconductor package revealed according to the present invention has the following advantages and functions:

1. The fingers at two opposing ends of the isolated inner lead are electrically connected to the finger of the external lead by a jumping wire overpassing at least one of the internal portions of the leads to make the jumping wire far away from the constrained wire-bonding area for electrically connecting the chip and the leads of the leadframe segment. Additionally, the jumping wire is formed at the same time as the normal bonding wires during wire-bonding process and to achieve redistributing pin assignments without affecting nor changing the normal bonding wires within the constrained wire-bonding area, especially for COL multi-chip packages.

2. The isolated inner lead having two opposing fingers can be mechanically fixed with the internal portions of the leads by an adhesive film beneath the leadframe segment and a layer of die attach material on the back surface of the chip.

3. In the multi-chip stacking applications, a second chip is stepwise stacked on the first chip to form a lateral extrusion exceeding the non-wire-bonding sides of the first chip so that the jumping wire can be hidden under the lateral extrusion to eliminate exposing the jumping wire from the encapsulant and to reduce the risk of wire sweeping.

4. The fingers of the external leads for cross wiring the isolated inner lead are inwardly extended into the die-attaching area to increase carrying strength of the chip.

DETAILED DESCRIPTION OF THE INVENTION

Please refer to the attached drawings, the present invention is described by means of embodiments below.

Figure 1:
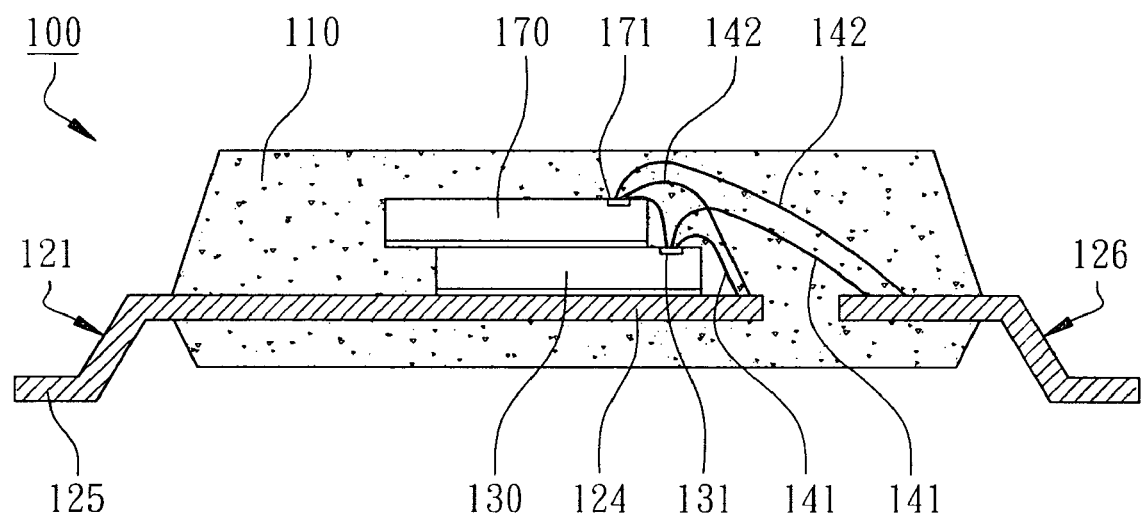
FIG. 1 is a cross-sectional view of a conventional leadframe-based semiconductor package.
Figure 2:
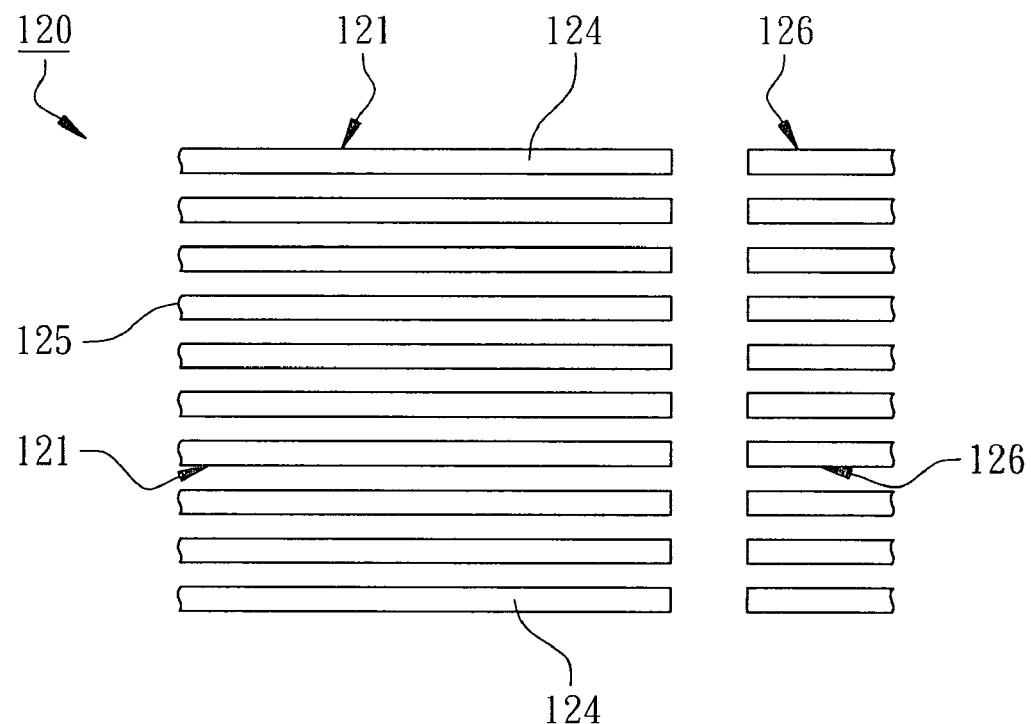
FIG. 2 is a partial top view of a leadframe segment in the encapsulant of the conventional leadframe-based semiconductor package.
Figure 3:
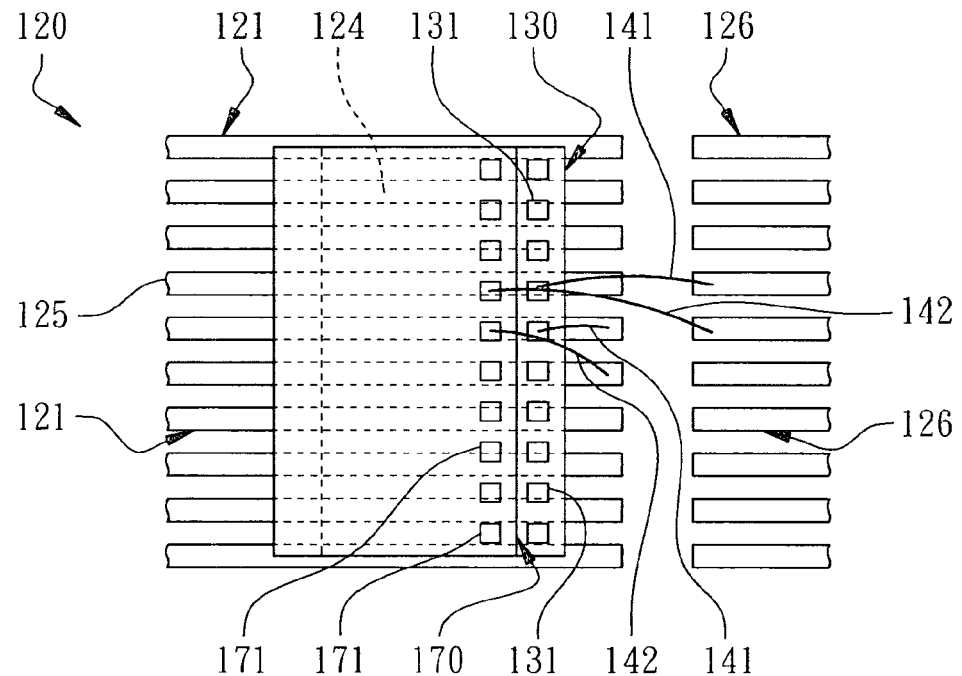
FIG. 3 is a partial top view showing the components with some wire-bonding connections in the encapsulant of the conventional leadframe-based semiconductor package.
Figure 4:
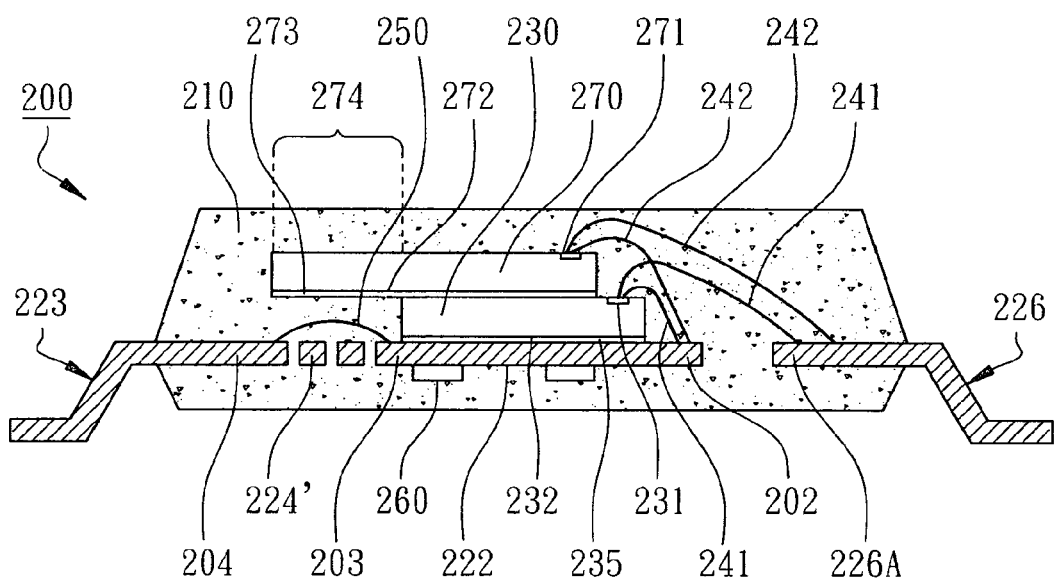
FIG. 4 is a cross-sectional view of a leadframe-based semiconductor package taken along an isolated inner lead and an external lead to show the connection of a jumping wire according to the first embodiment of the present invention.
Figure 5:
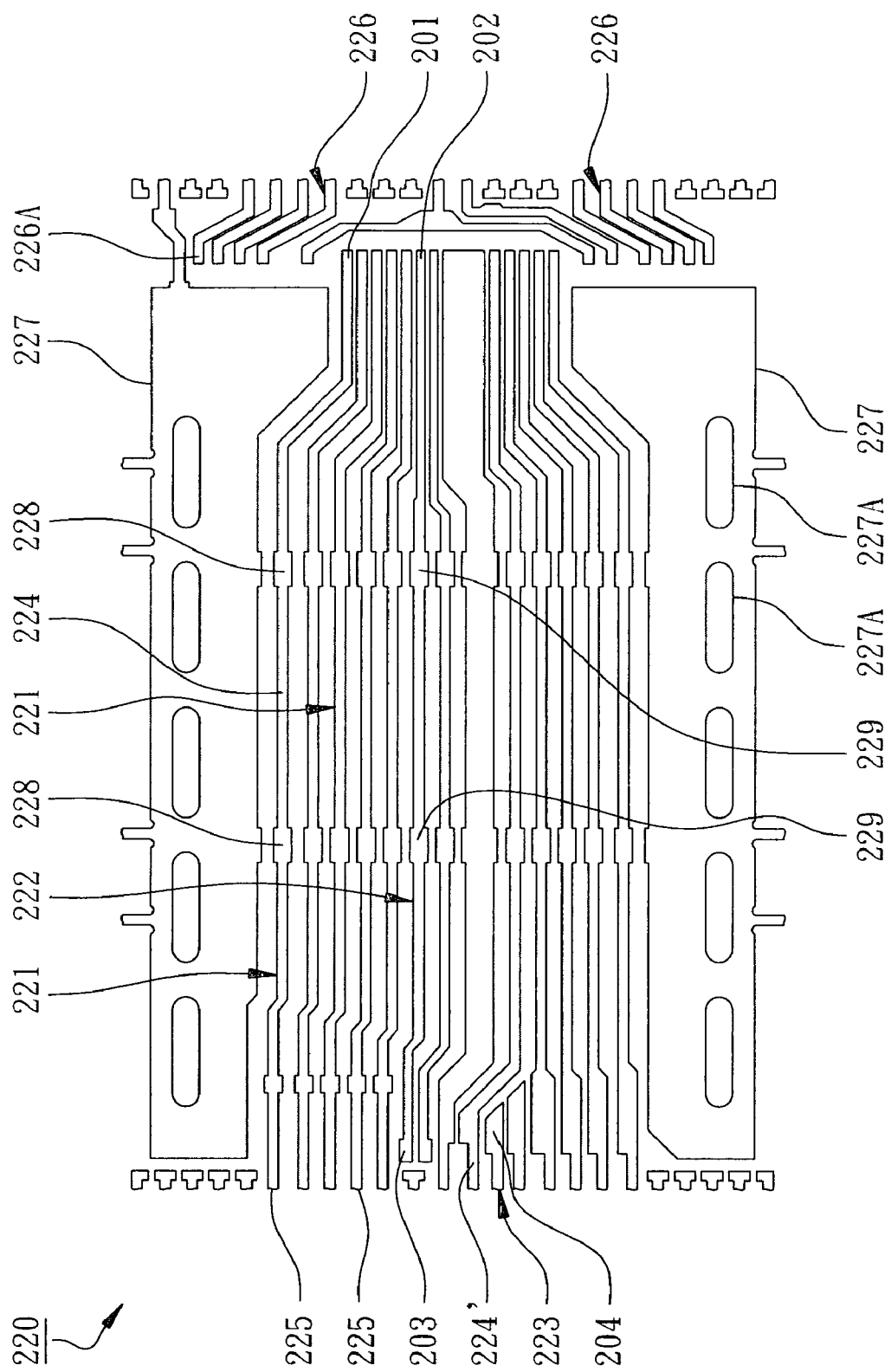
FIG. 5 is a partial top view of a leadframe segment in the encapsulant of a leadframe-based semiconductor package according to the first embodiment of the present invention.
Figure 6:
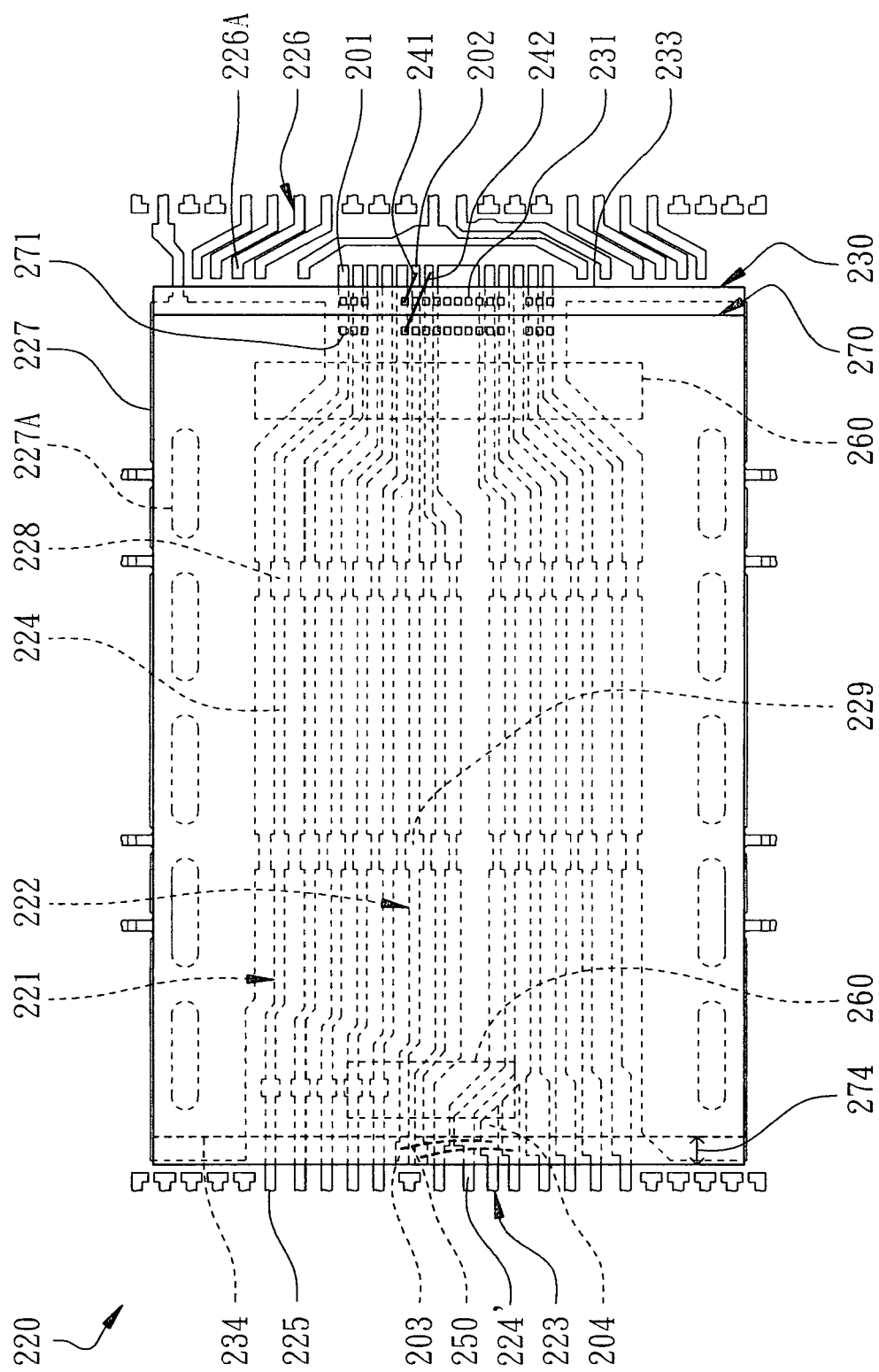
FIG. 6 is a partial top view showing the components with characterized wire-bonding connections in the encapsulant of a leadframe-based semiconductor package according to the first embodiment of the present invention.
Figure 7:
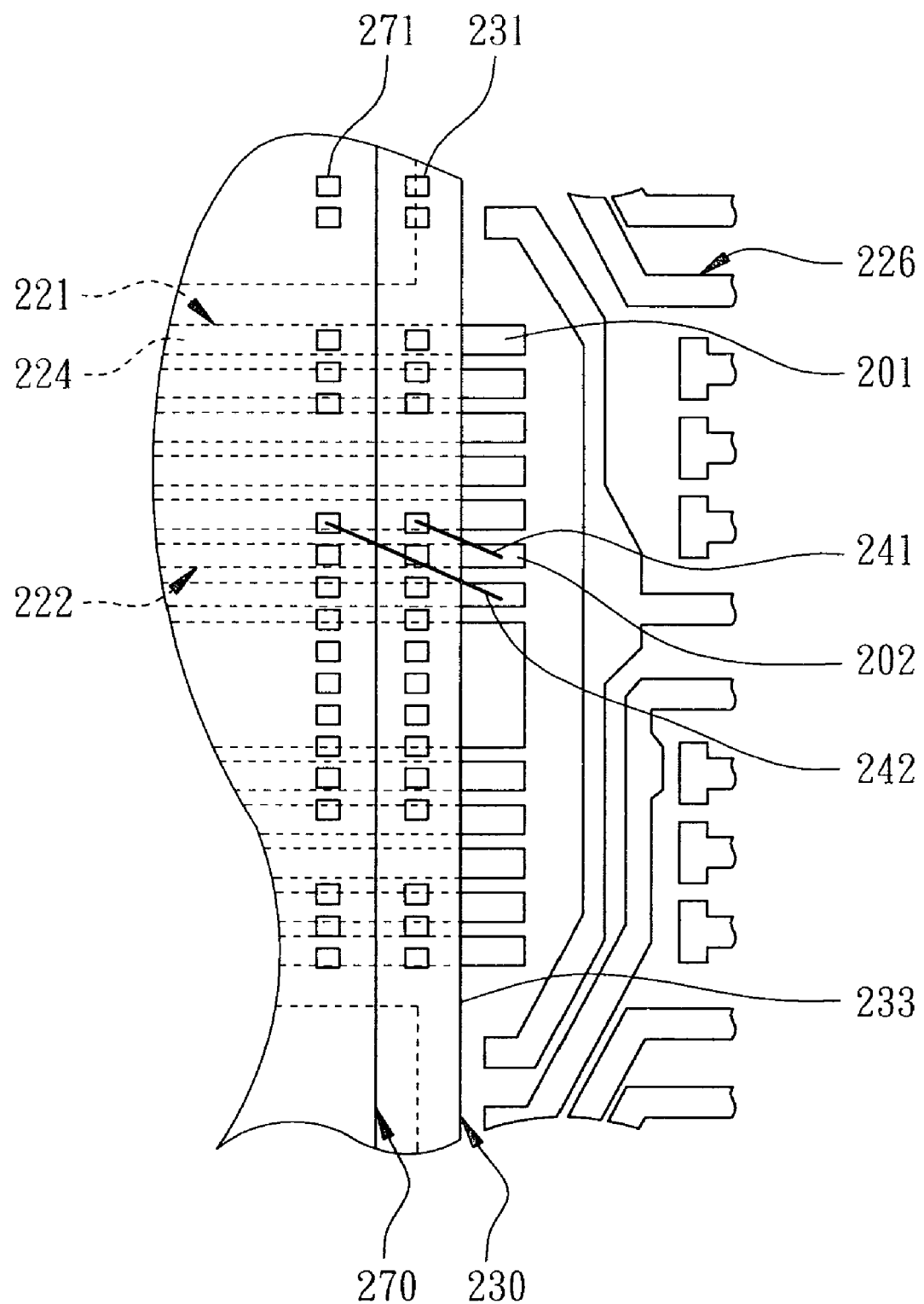
FIG. 7 is a partial enlarged view of FIG. 6 to show the wire-bonding area according to the first embodiment of the present invention.
Figure 8:
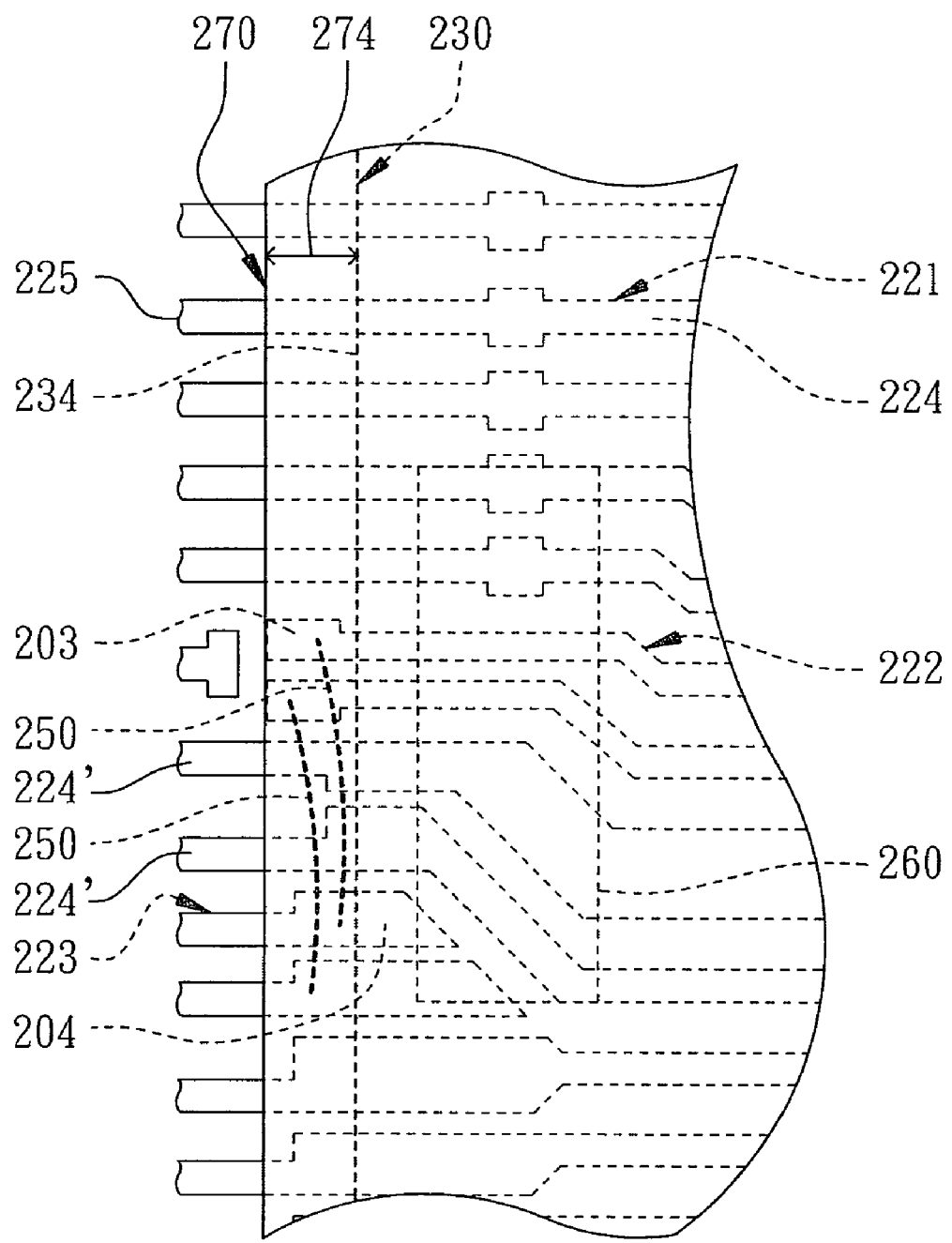
FIG. 8 is a partial enlarged view of FIG. 6 to show the jumping wire according to the first embodiment of the present invention.
Figure 9:
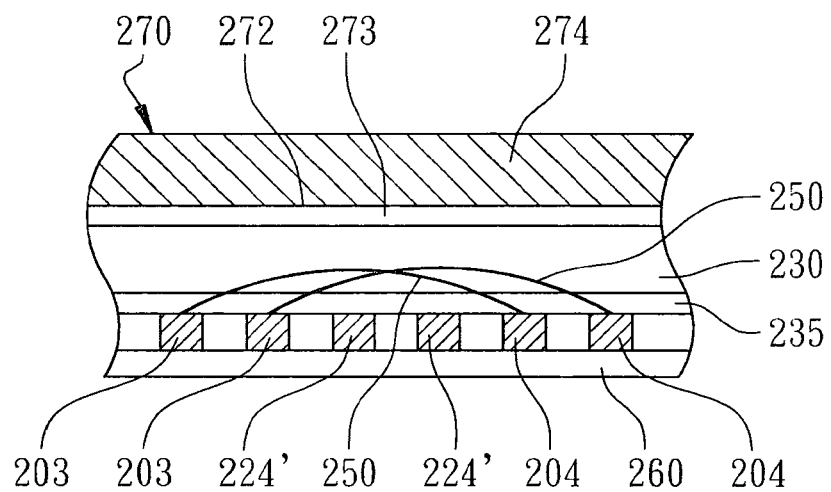
FIG. 9 is a partial cross-sectional view of FIG. 8.
Figure 10:
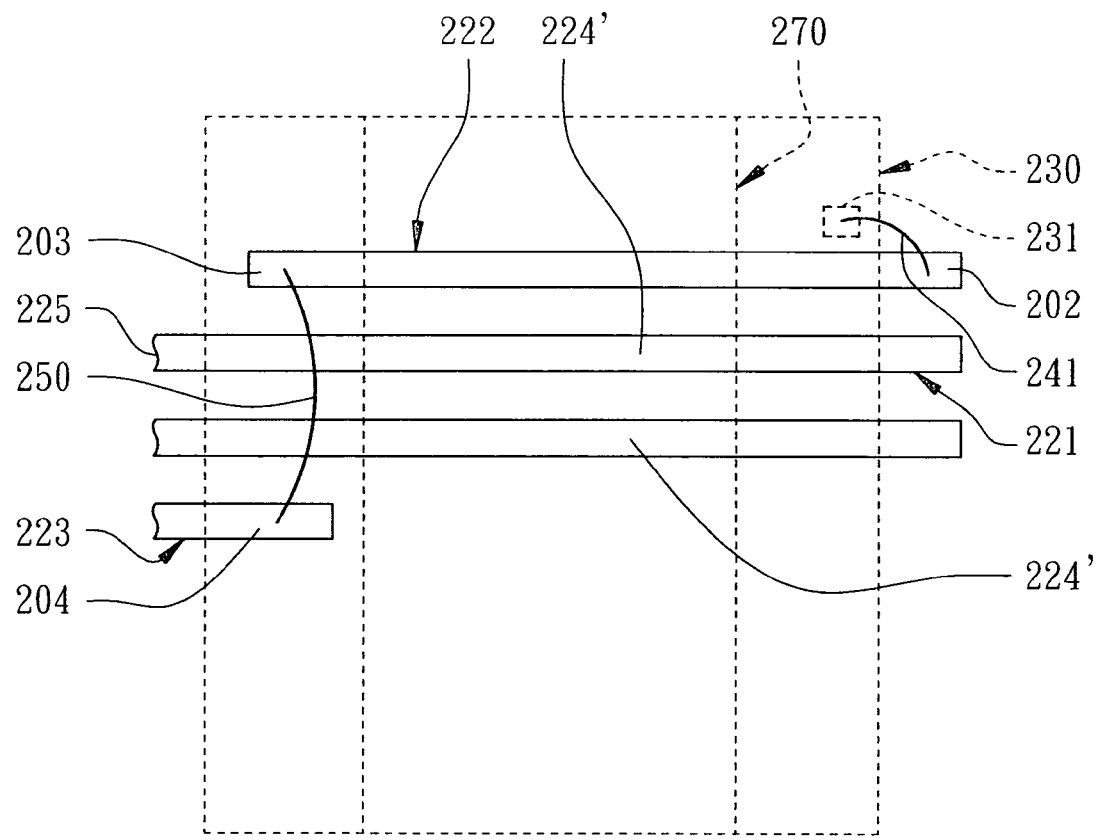
FIG. 10 is a top view showing the simplified electrical connections of the leadframe-based semiconductor package according to the first embodiment of the present invention.

According to the first embodiment of the present invention, a leadframe-based semiconductor package is illustrated in FIG. 4 for a cross-sectional view taken along an isolated inner lead 222 and an external lead 223 of the leadframe segment 220. The leadframe-based semiconductor package 200 primarily comprises an encapsulant 210, a leadframe segment 220 as shown in FIG. 5, a first chip 230, a plurality of bonding wires 241 and 242, and at least a jumping wire 250. In the present embodiment, the leadframe-based semiconductor packages 200 is implemented in multi-chip stacking with COL configuration. The semiconductor package 200 further comprising a second chip 270 disposed on the first chip 230. FIG. 5 is a partial top view of the leadframe segment 220 in the encapsulant 210 of the leadframe-based semiconductor package 200. FIG. 6 shows the components in the encapsulant 210 of the leadframe-based semiconductor package 200 and the characterized wire-bonding connections. FIG. 7 shows the bonding wires 241 and 242 within the wire-bonding area. FIG. 8 shows the jumping wire 250 far away from the wire-bonding area. FIG. 9 shows the jumping wire 250 hidden below the second chip 270. FIG. 10 shows the simplified electrical connections from the first chip 230 to the external lead 223 of the leadframe segment 220.

The encapsulant 210 is an electrical-isolated thermal-setting resin such as epoxy molding compound (EMC) to encapsulate the first chip 230, the internally electrically connecting components including the bonding wires 241, 242 and the jumping wire 250, and some portions of the leadframe segment 220 where the leadframe segment 220 is formed by a fully metal sheet made of copper, iron, or its alloy.

As shown in FIG. 5, the leadframe segment 200 includes a plurality of leads 221, at least an isolated inner lead 222, and at least an external lead 223 where the isolated inner lead 222 is completely formed inside the encapsulant 210 without exposed lead portions for external electrical connection. The external lead 223 is partially formed inside the encapsulant 210 and extended outside the encapsulant 210 where the external lead 223 acts as the external electrical connections of the isolated inner lead 222 without directly mechanical and electrical connection with the isolated inner lead 222. Moreover, each lead 221 has an internal portion 224 inside the encapsulant 210 and an external portion 225 extended outside the encapsulant 210 where the internal portion 224 and the external portion 225 are integrally connected to each other. At least one of the internal portion 224' among the internal portions 224 is located between the isolated inner lead 222 and the external lead 223 with electrically isolating relationship. In the present embodiment, there are two internal portions 224' between the isolated inner lead 222 and the external lead 223. Preferably, the isolated inner lead 222 and the internal portions 224 of the leads 221 are formed from a horizontal layer of the leadframe segment 220 so that the isolated inner lead 222 and the internal portions 224 of the leads 221 are horizontally disposed without overlapping. Therefore, the deposition of the isolated inner lead 222 is the same as the one of the internal portions 224 of the leads 221 and the disposition of the external lead 223 is the same as the one of the external portions 225 of the leads 221.

As shown in FIG. 4, the first chip 230 is disposed on the leadframe segment 220 and encapsulated by the encapsulant 210 where the first chip 230 has a plurality of first electrodes 231 on its active surface. As shown in FIG. 4 and FIG. 6, a back surface 232 of the first chip 230 opposing to the active surface can be attached to the isolated inner lead 222 and the internal portions 224 by a layer of first die attach material 235 since the isolated inner lead 222 is formed from the same layer with the internal portions 224 of the leads 221. Specifically, the internal portions 224 and the isolated inner lead 222 within the die-attaching area are coplanar for firmly attaching the back surface 232 of the first chip 230. In one of the embodiment, the layer of first die attach material 235 is coated on the back surface 232 of the first chip 230 in advance, and then is attached to the leadframe segment 220 to prevent serious resin bleeding. As shown in FIG. 6 and FIG. 7, a first finger 201 is formed at the internal end of each internal portion 224 without covering by the first chip 230. As shown in FIG. 4 and FIG. 6, the isolated inner lead 222 has a second finger 202 and a third finger 203 at two opposing ends thereof. As especially shown in FIG. 7, the second finger 202 is protruded from a first side 233 of the first chip 230 without covering by the first chip 230 for wire-bonding connection. As especially shown in FIG. 8, the third finger 203 is protruded from a second side 234 of the first chip 230 without covering by the first chip 230 for wire-bonding connection. Furthermore, as shown in FIG. 4, FIG. 6, and FIG. 8, the external lead 223 has a fourth finger 204 without covering by the first chip 230 and located adjacent to the third finger 203. The first fingers 201 and the second finger 202 are arranged along the first side 233 of the first chip 230 as shown in FIG. 7. Third finger 203 and the fourth finger 204 are arranged along the second side 234 of the first chip 230 as shown in FIG. 8. Therefore, the area adjacent to the first side 233 can be defined as the normal wire-bonding area for disposing the bonding wires 241 and 242 and the area adjacent to the second side 234 can be defined as the jumping-wire area for COL packaging without interfering to each other. In the present embodiment, as shown in FIG. 6, the first side 233 and the second side 234 are two opposing parallel sides of the first chip 230.

The first bonding wires 241 and the jumping wire 250 are formed by wire bonding. As shown in FIG. 4, FIG. 6, and FIG. 7, the first bonding wires 241 electrically connect the first electrodes 231 of the first chip 230 to the first fingers 201 of the internal portions 224 and to the second finger 202 of the isolated inner lead 222. Since the first bonding wires 241 electrically connecting the first electrodes 231 to the first fingers 201 are normal bonding wires, therefore, only parts of the first bonding wires 241 are shown in FIG. 6 and FIG. 7.

As shown in FIG. 4, FIG. 6, and FIG. 8, the jumping wire 250 electrically connects the third finger 203 of the isolated inner lead 222 to the fourth finger 204 of the external lead 223 overpassing the internal portions 224' interposed between the third finger 203 and the fourth finger 204. In the present embodiment, the jumping wire 250 overpasses two internal portions 224'. When there are several isolated inner leads 222 and external leads 223, a plurality of jumping wires 250 can overpass at least one internal portions 224' of the isolated inner leads 222 or further overpass at least one external lead 223 or the third finger 203, as shown in FIG. 8. Preferably, the jumping wire 250 adjacent to the second side 234 of the first chip 230 is located on the leadframe segment 220 as the same as the first bonding wires 241 on the leadframe segment 220 so that the first bonding wires 241 and the jumping wire 250 can be formed in the same wire-bonding process without interfering to each other and without flipping over the leadframe segment 220. As shown in FIG. 8, according to the top view of the semiconductor package, the jumping wire 250 is approximately parallel to the second side 234 of the first chip 230 to avoid direct contact of the jumping wire 250 to the second side 234 of the first chip 230 due to the impact of mold flow.

The redistributed pin assignment without affecting or changing the wire-bonding area of the COL package is further illustrated in FIG. 10. One of the first bonding wires 241 electrically connects one of the first bonding electrodes 231 of the first chip 230 to the second fingers 202 of the isolated inner leads 222 without cross-wiring with the adjacent first bonding wires 241. The first bonding electrode 231 is further electrically connected to the third finger 203 through the isolated inner lead 222. The isolated inner lead 222 forms a conductive path under the back surface 232 of the first chip 230 to make the third finger 203 far away from the normal wire-bonding area of the first bonding wires 241. One end of the jumping wire 250 is bonded on the third bonding wire 203 of the isolated inner lead 222 and overpassed at least one internal portion 224' of the leads 221. The other end of the jumping wire 250 is bonded on the fourth finger 204 of the external lead 223. Therefore, the pad assignment of the first bonding electrodes 231 of the first chip 230 can be different from the pin assignment of the external portions 225 of the leads 221 by overpassing one or more external portions 225 of the leads 221 to redistribute pin assignments. In the present embodiment, there are two leads 221 overpassed by the jumping wire 250 to redistribute the pin assignment, as shown in FIG. 6.

Therefore, the electrical connections between the isolated inner lead 222 and the jumping wire 250 of the leadframe-based semiconductor package according to the present invention, especially for COL packages, enables the jumping wire 250 to be far away from the constrained wire-bonding area including the first bonding wires 241 and forms in the same wire-bonding processes as the first bonding wires 241 to achieve redistributing pin assignments of COL packages without affecting nor changing the constrained wire-bonding area, especially for multi-chip stacked package with wire-bonding connections.

Since the isolated inner lead 222 cannot be clamped by the top and bottom mold tools, the semiconductor package 200 may further comprises at least an adhesive film 260 which is attached to the leadframe segment 220 in the encapsulant 210 so that the isolated inner lead 222 and the internal portions 224 are mechanically fixed but electrically isolated each other. In the present embodiment, the adhesive film 260 is disposed inside the covering area of the first chip 230. Two opposing ends of the isolated inner lead 222 are not covered by the adhesive film 260.

As shown in FIG. 4, in the multi-chip applications, the semiconductor package 200 further comprises a second chip 270 disposed on the first chip 230. A second die attach material 273 might be disposed on the back surface 272 of the second chip 270. A plurality of second bonding wires 242 electrically connect the second electrodes 271 of the second chip 270 to the first fingers 201 of the leads 221 and the second finger 202 of the isolated inner lead 222. Or one or more second bonding wires 242 can electrically connect the second electrodes 271 of the second chip 270 to the first electrodes 231 of the first chip 230 with the same signals or functions, therefore, the wire-bonding density of the wire-bonding area can be higher when the number of the stacked chips is increased. However, any cross wiring will easily cause wire sweeping issues. Preferably, as shown in FIG. 4 and FIG. 8, the second chip 270 can be stepwise stacked on the first chip 230 to have a lateral extrusion 274 exceeding the second side 234 of the first chip 230. The jumping wire 250 is hidden under the lateral extrusion 274, as shown in FIG. 4, FIG. 8 and FIG. 9, so that the jumping wire 250 will not be exposed from the encapsulant 210 nor electrical short even wire sweeping is happened during molding processes. Preferably, the second die attach material 273 can further extend and cover the bottom surface of the lateral extrusion 274 to avoid the jumping wire 250 directly contacting to the back surface 272 of the second chip 270, as shown in FIG. 9. However, without limitations, in a different embodiment, the second chip 270 can vertically stack on the first chip 230 where an interposer such as a dummy chip or Film-Over-Wire (FOW) adhesive can be disposed between the chips to maintain a wire-bonding gap so that the jumping wire 250 might not be located under the second chip 270.

In a more specific embodiment, as shown in FIG. 5 again, the leadframe segment 220 further includes a plurality of short leads 226 shorter than the leads 221 where the first chip 230 is not disposed on the short leads 226. The first side 233 and the second side 234 of the first chip are parallel to each other where the short leads 226 have a plurality of internal terminals 226A facing the first side 233 for wire-bonding.

In the embodiment of the leadframe-based semiconductor package with isolated inner lead(s), especially for multi-chip stacking packages, the chip carrying strength to carry the first chip 230 and the second chip 270 can be improved not only by the internal portions 224 of the leads 221. Preferably, as shown in FIG. 6 and FIG. 8, the fourth finger 204 of the external lead 223 can inwardly extend onto the back surface of the first chip 230 to support and carry the first chip 230. The first die attach material 235 with resin bleeding under control can adhere to the inwardly extending portion of the fourth fingers 204. In the preferred embodiment, as shown in FIG. 5 and FIG. 6, the leadframe segment 220 further includes a plurality of side-supporting pads 227 arranged at two sides of the internal portions 224 of the leads 221 to support and carry the first chip 230. To be more specific, the side-supporting pads 227 have a plurality of moldflow through holes 227A for tilling the encapsulant 210 to have better control and distribution of moldflows and to enhance the bonding strength between the side-supporting pads 227 and the encapsulant 210. In the present embodiment, the widths of a specific portion of the internal portions 224 under the first chip 230 can be widened to form a plurality of first locking pads 228. The widths of a specific portion of the isolated inner leads 222 under the first chip 230 can also be widened to form at least a second locking pad 229. The first locking pads 228 and the second locking pad 229 can be linearly arranged to enhance the support strengths of the first chip 230 and to increase mechanical fixing strength of the leads 224 and the isolated inner leads 222 by the encapsulant 210 without lead shifting nor peeling issues.

Figure 11:
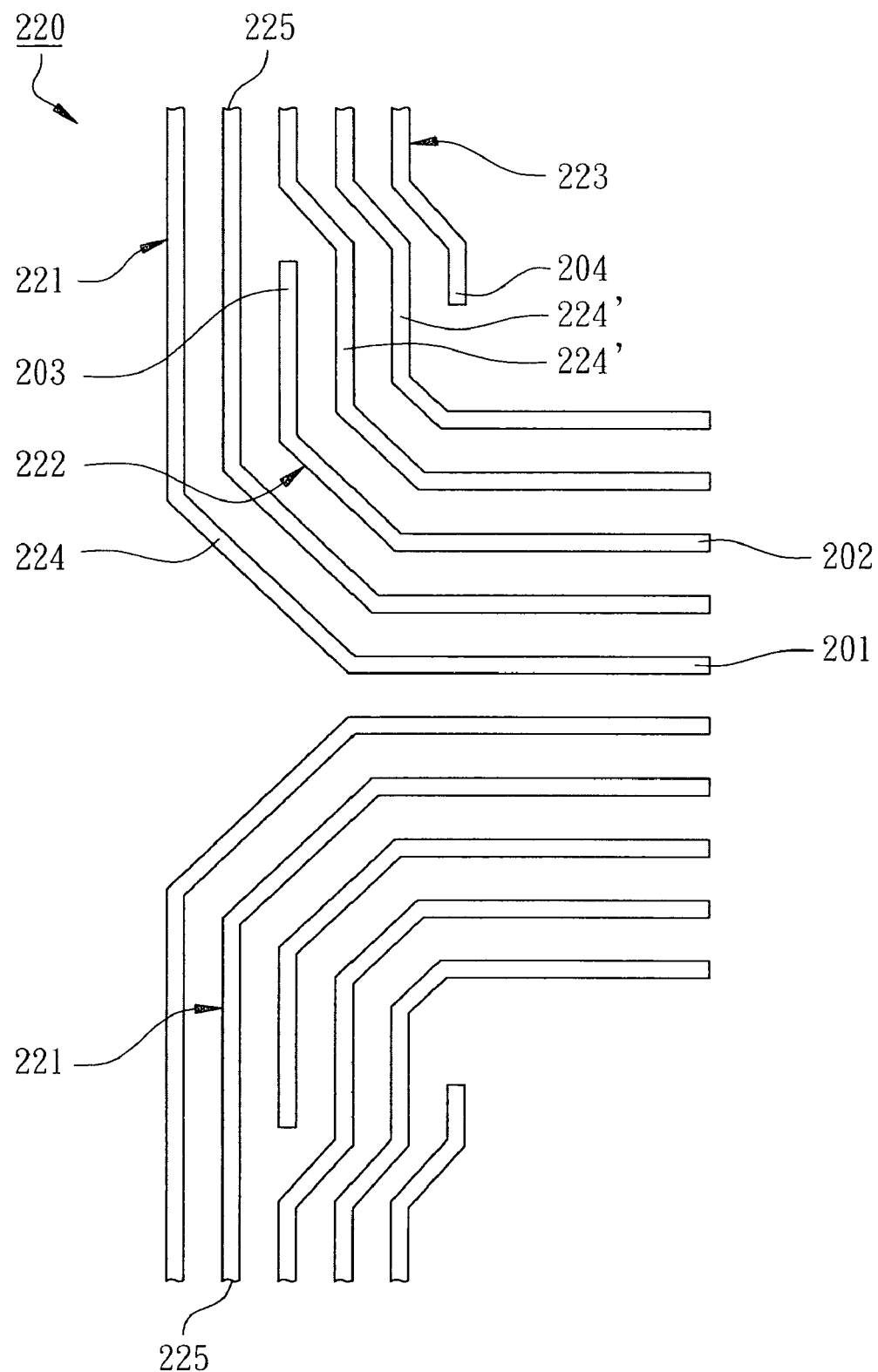
FIG. 11 is a partial top view of a leadframe segment in the encapsulant of a leadframe-based semiconductor package according to the second embodiment of the present invention.
Figure 12:
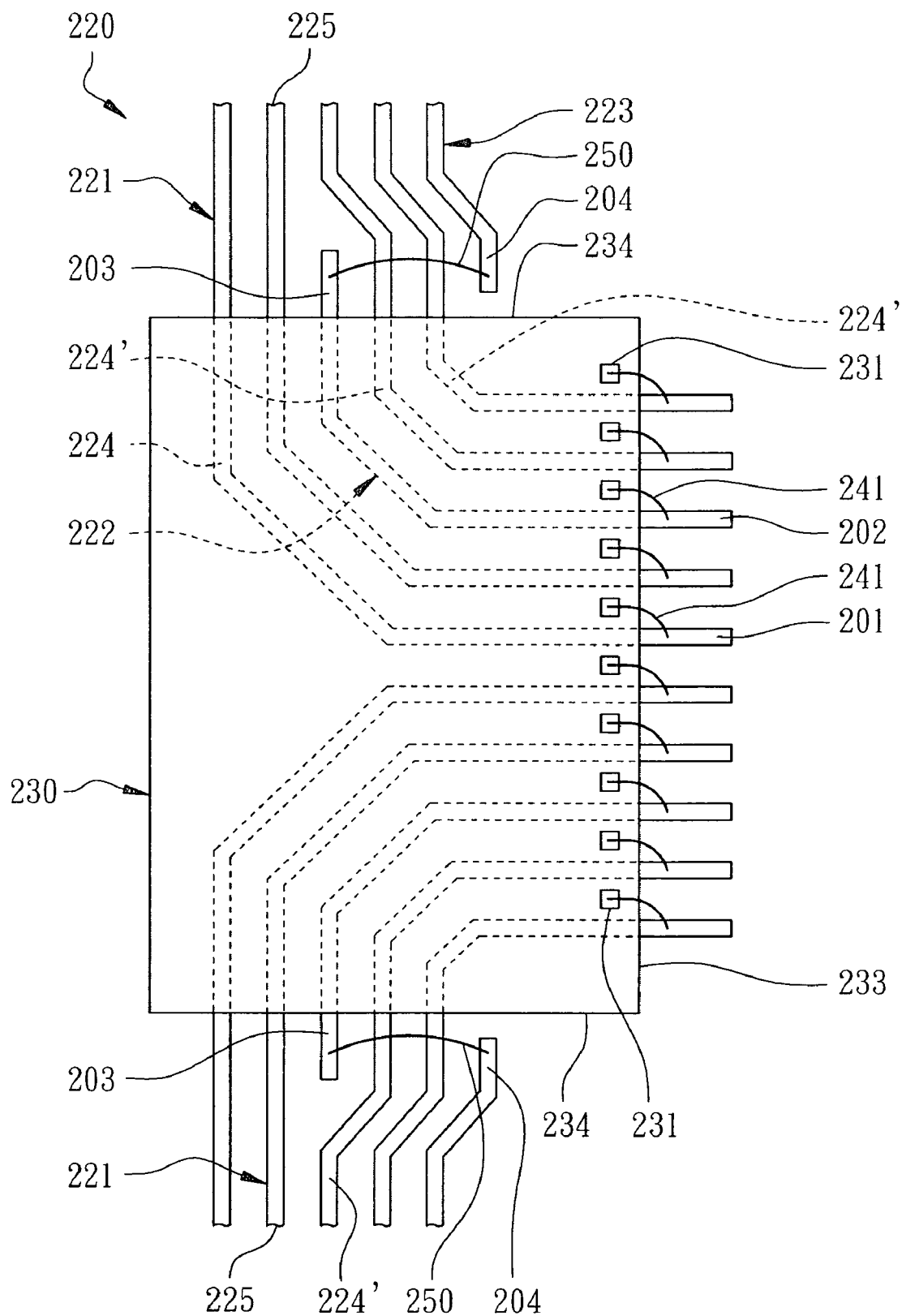
FIG. 12 is a partial top view showing the components with wire-bonding connections in the encapsulant of a leadframe-based semiconductor package according to the second embodiment of the present invention.

According to the second embodiment of the present invention, another leadframe-based semiconductor package with isolated inner lead(s) is illustrated in FIG. 11 for a partial top view of a leadframe segment 220 inside an encapsulant of the package and in FIG. 12 for a partial top view of the components including the leadframe segment 220 with wire-bonding connections in the encapsulant. Moreover, the components and the description numbers are the same as the first embodiment without further explanations herein. The semiconductor package primarily comprises the encapsulant, the leadframe segment 220, a chip 230 disposed on the leadframe segment 220, a plurality of bonding wires 241, and at least a jumping wire 250.

As shown in FIG. 11, the leadframe segment 220 includes a plurality of leads 221, at least an isolated inner lead 222, and at least an external lead 223. Each lead 221 has an internal portion 224 inside the encapsulant and an external portion 225 extended outside the encapsulant where the internal portion 224 and the external portion 225 are integrally connected to each other. Moreover, a first finger 201 is formed at the internal end of each internal portion 224 and the isolated inner lead 222 is completely formed inside the encapsulant. A second finger 202 and a third finger 203 are formed at two opposing ends of the isolated inner lead 222. The first fingers 201 and the second finger 202 are disposed adjacent to each other in a group. As shown in FIG. 12, the first fingers 201 and the second finger 202 are arranged along a first side 233 of the first chip 230. The third finger 203 and the fourth finger 204 are arranged along a second side 234 of the first chip 230. The external lead 223 is partially formed inside and extended outside the encapsulant 210 where the external lead 223 has a fourth finger 204 adjacent to the third finger 203 and closely arranged in another group. At least an internal portion 224' of the internal portions 224 of the leads 224 is located between the isolated inner lead 222 and the external lead 223 so that the isolated inner lead 222 can be electrically isolated from and mechanically fixed to the external lead 223. In the present embodiment, the external portions 225 of the leads 221 are disposed at two opposing and parallel sides of the encapsulant.

As shown in FIG. 12, the first chip 230 is disposed on the leadframe segment 220 and encapsulated by the encapsulant 210 where the first chip 230 has a plurality of first electrodes 231. The back surface of the first chip 230 is attached to the internal portions 224 and the isolated inner lead 222 where the first fingers 201 of the first internal portions 224, the second finger 202 and the third finger 203 of the isolated inner lead 222, and the fourth finger 204 of the external lead 223 are not covered by the first chip 230. In the present embodiment, the first side 233 and the second side 234 of the first chip 230 can be perpendicular to each other. All or most of the leads 221 are configured for supporting and carrying the first chip 230 so that the short leads can be eliminated.

Furthermore, the bonding wires 241 electrically connect the first electrodes 231 of the first chip 230 to the first fingers 201 of the internal portions 224 and to the second finger 202 of the isolated inner lead 222. The general wire-bonding area including the bonding wires 241 is located at the first side 233 of the first chip 230. The jumping wire 250 electrically connects the third finger 203 of the isolated inner lead 222 to the fourth finger 204 of the external lead 223 and overpasses the interposing internal portion 224' so that the wire-jumping area including the jumping wire 250 is located at the second side 234 of the first chip 230. Therefore, the wire-jumping area is far away from the general wire-bonding area to avoid wires crossing. Pin assignments can be redistributed on COL packages without affecting nor changing the constrained wire-bonding area of COL packages.

The above description of embodiments of this invention is intended to be illustrative but not limiting. Other embodiments of this invention will be obvious to those skilled in the art in view of the above disclosure.

What is claimed is:

1. A semiconductor package primarily comprising:
    an encapsulant;
    a leadframe segment having a plurality of leads, an isolated inner lead, and an external lead, wherein the isolated inner lead is completely encapsulated inside the encapsulant and the external lead is partially formed inside and extended outside the encapsulant; wherein each lead has an internal portion encapsulated inside the encapsulant and an external portion extended outside the encapsulant and integrally connected with the internal portion, wherein at least one of the internal portions is located between the isolated inner lead and the external lead;
    a first chip disposed on the leadframe segment and encapsulated by the encapsulant, wherein the first chip has a plurality of first electrodes; wherein each internal portion has a first finger; wherein the isolated inner lead has a second finger and a third finger at two opposing ends thereof; wherein the external lead has a fourth finger; wherein the first fingers and the second finger are arranged along a first side of the first chip without covered by the first chip and the third finger and the fourth finger are arranged along a second side of the first chip without covered by the first chip;
a plurality of first bonding wires encapsulated by the encapsulant, wherein the first bonding wires electrically connect the first electrodes of the first chip to the first fingers of the internal portions and to the second finger of the isolated inner lead; and
a jumping wire encapsulated by the encapsulant, wherein the jumping wire electrically connects the third finger of the isolated inner lead to the fourth finger of the external lead overpassing the interposing one of the internal portions,
wherein the isolated inner lead and the internal portions are formed from a horizontal layer of the leadframe segment; and
wherein a back surface of the first chip is attached to the internal portions and the isolated inner lead.

2. The semiconductor package as claimed in claim 1, further comprising an adhesive film in the encapsulant, the adhesive film attached to the leadframe segment to mechanically fix the isolated inner lead and the internal portions.

3. The semiconductor package as claimed in claim 1, further comprising a layer of first die attach material disposed on a back surface of the first chip for bonding to the leadframe segment.

4. The semiconductor package as claimed in claim 3, wherein the fourth finger of the external lead inwardly extends onto the back surface of the first chip, and wherein the first die attach material adheres to the inwardly extending portion of the fourth finger.

5. The semiconductor package as claimed in claim 1, wherein the jumping wire is adjacent to the second side of the first chip.

6. The semiconductor package as claimed in claim 5, wherein the jumping wire is approximately parallel to the second side of the first chip.

7. The semiconductor package as claimed in claim 1, further comprising a second chip disposed on the first chip.

8. The semiconductor package as claimed in claim 7, further comprising a layer of second die attach material disposed on the second chip for bonding to the first chip.

9. The semiconductor package as claimed in claim 8, wherein the second chip is stepwise disposed on the first chip to have a lateral extrusion exceeding the second side of the first chip, wherein the jumping wire is hidden under the lateral extrusion.

10. The semiconductor package as claimed in claim 9, wherein the second die attach material further covers a bottom of the lateral extrusion.

11. The semiconductor package as claimed in claim 1, wherein the leadframe segment further includes a plurality of short leads shorter than the leads so that the first chip is not disposed on the short leads.

12. The semiconductor package as claimed in claim 11, wherein the first side and the second side of the first chip are parallel to each other with a plurality of internal terminals of the short leads facing the first side.

13. The semiconductor package as claimed in claim 1, wherein the first side and the second side of the first chip are perpendicular to each other.

14. The semiconductor package as claimed in claim 13, wherein the external portions of the leads are disposed at two opposing and parallel sides of the encapsulant.

15. The semiconductor package as claimed in claim 1, wherein the leadframe segment further includes a plurality of side-supporting pads arranged at two opposing sides of the internal portions of the leads.

16. The semiconductor package as claimed in claim 15, wherein the side-supporting pads have a plurality of moldflow through holes to be filled with the encapsulant.

* * * * *